United States Patent
Lee

(10) Patent No.: US 8,238,153 B2
(45) Date of Patent: Aug. 7, 2012

(54) PROGRAM METHOD OF FLASH MEMORY DEVICE

(75) Inventor: Hee Youl Lee, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 12/903,968

(22) Filed: Oct. 13, 2010

(65) Prior Publication Data

US 2011/0026330 A1   Feb. 3, 2011

Related U.S. Application Data

(62) Division of application No. 11/965,345, filed on Dec. 27, 2007, now abandoned.

(30) Foreign Application Priority Data

Sep. 10, 2007  (KR) .................................. 2007-91529

(51) Int. Cl.
*G11C 16/04* (2006.01)

(52) U.S. Cl. ......... 365/185.02; 365/185.17; 365/185.18; 365/185.19

(58) Field of Classification Search ............. 365/185.25, 365/185.02, 185.17, 185.19, 185.18
See application file for complete search history.

(56) References Cited

U.S. PATENT DOCUMENTS

| | | | |
|---|---|---|---|
| 5,570,315 A | 10/1996 | Tanaka et al. | |
| 6,049,494 A | 4/2000 | Sakui et al. | |
| 6,134,157 A * | 10/2000 | Takeuchi | 365/200 |
| 6,614,688 B2 | 9/2003 | Jeong et al. | |
| 6,859,394 B2 | 2/2005 | Matsunaga et al. | |
| 7,184,308 B2 * | 2/2007 | Kwon et al. | 365/185.17 |
| 7,468,918 B2 * | 12/2008 | Dong et al. | 365/185.25 |
| 2005/0117399 A1 | 6/2005 | Kwon et al. | |

FOREIGN PATENT DOCUMENTS

KR     1020060037648 A     5/2006

* cited by examiner

*Primary Examiner* — VanThu Nguyen

(74) *Attorney, Agent, or Firm* — Kilpatrick Townsend & Stockton LLP

(57) ABSTRACT

In a program method of a flash memory device where memory cells within a string are turned on to electrically connect channel regions, all of the channel regions within a second string are precharged uniformly by applying a ground voltage to a first bit line connected to a first string including to-be-programmed cells and a program-inhibited voltage to a second bit line connected to the second string including program-inhibited cells. If a program operation is executed, channel boosting occurs in the channel regions within the second string including the program-inhibited cells. Accordingly, a channel boosting potential can be increased and a program disturbance phenomenon, in which the threshold voltage of program-inhibited cells is changed, can be prevented.

29 Claims, 9 Drawing Sheets

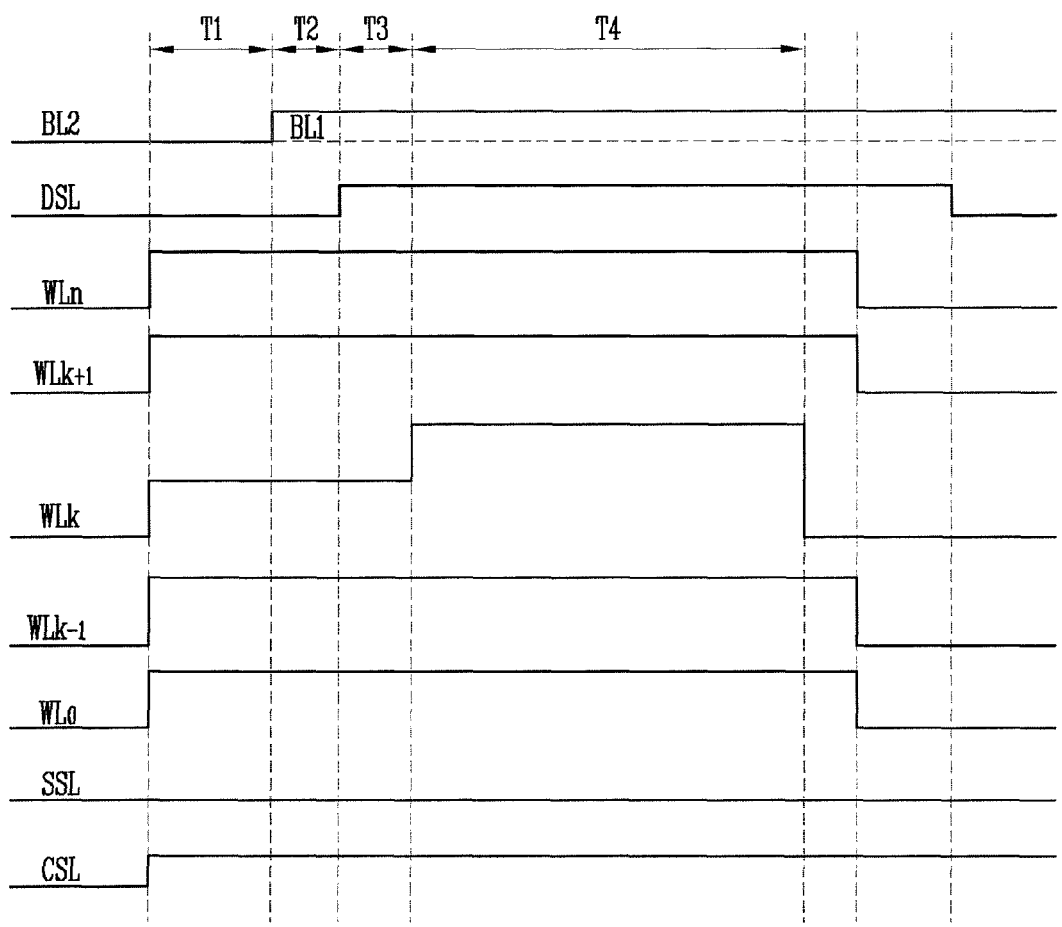

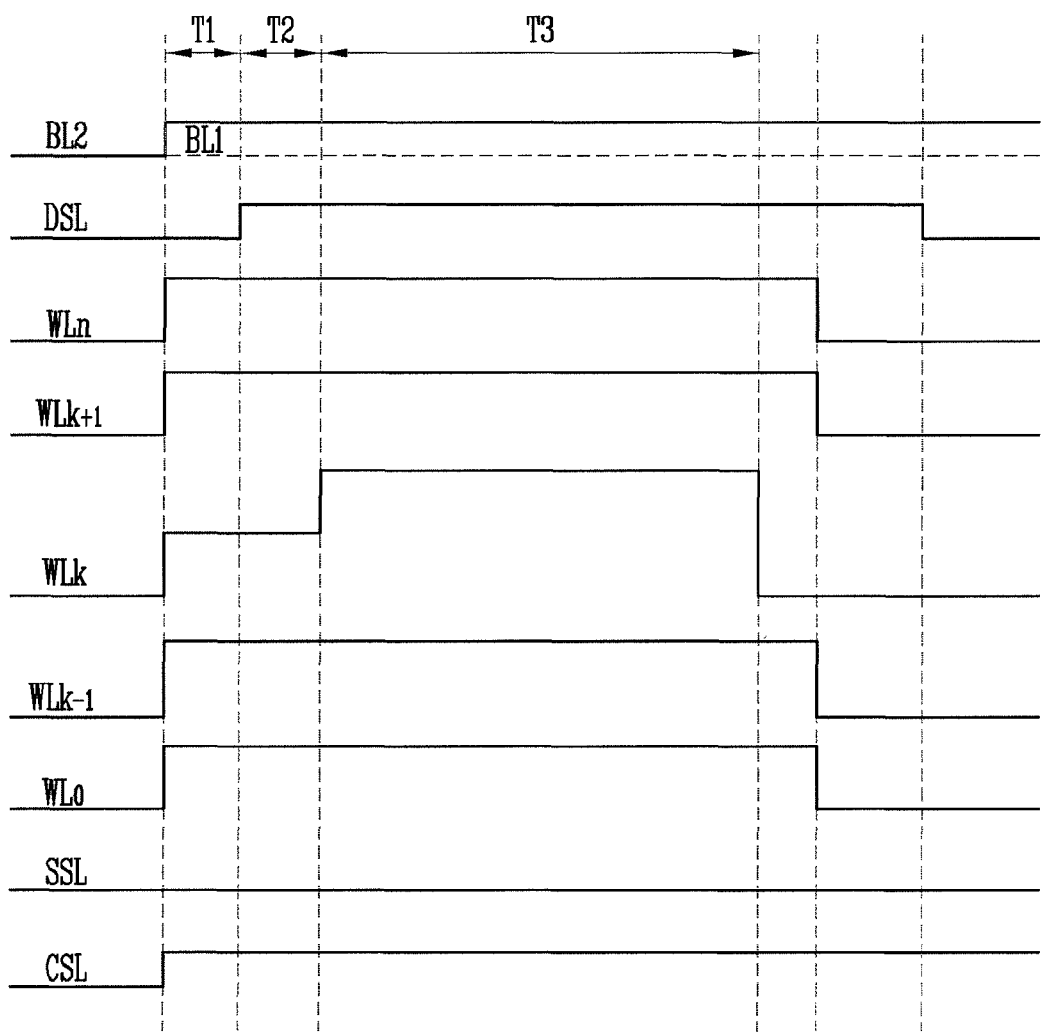

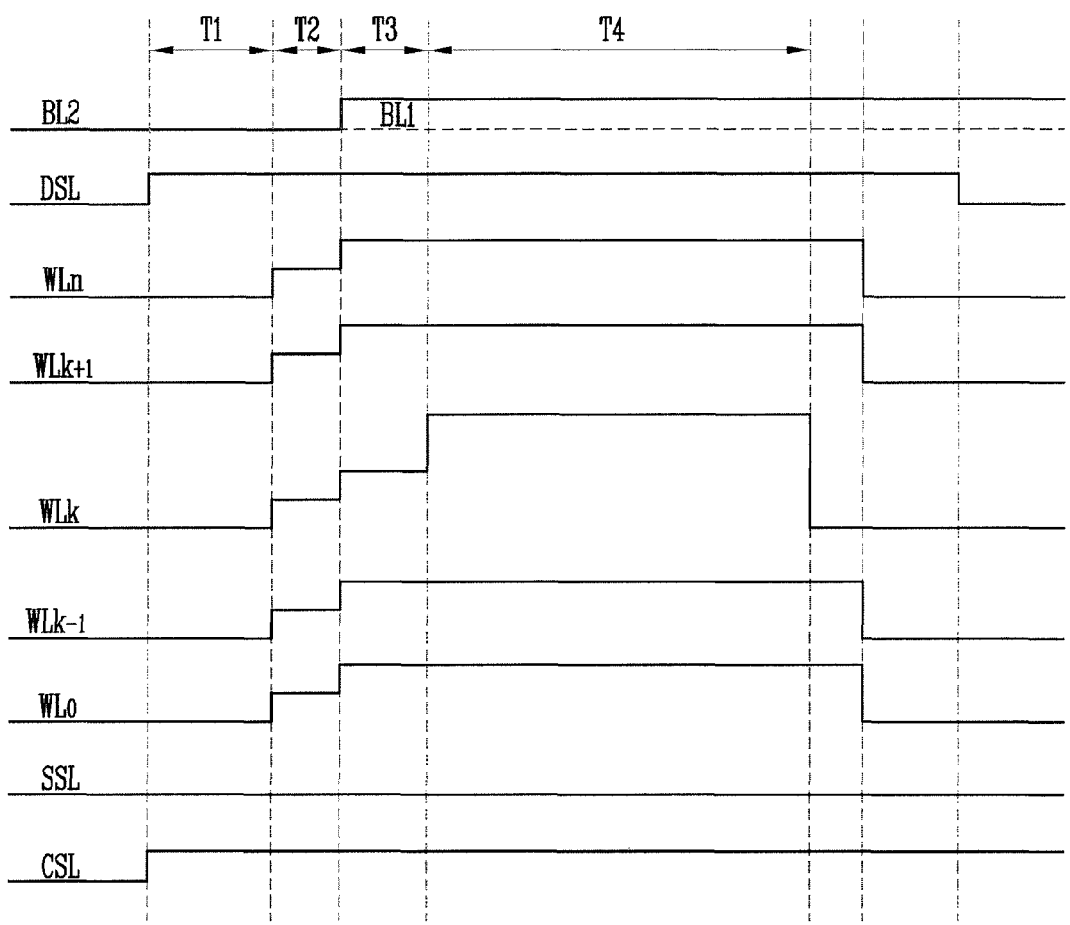

PROGRAM METHOD OF FLASH MEMORY DEVICE

CROSS-REFERENCES TO RELATED APPLICATIONS

The present application is a divisional of U.S. patent application Ser. No. 11/965,345, filed on Dec. 27, 2007, which claims priority to Korean patent application number 10-2007-91529, filed on Sep. 10, 2007, both of which are incorporated by reference in their entirety.

BACKGROUND OF THE INVENTION

The present invention relates to a program method of a flash memory device and, more particularly, to a program method of a flash memory device, which minimizes program disturbance during a program operation.

A flash memory device is a type of non-volatile memory device in which stored data is not erased when a power supply is removed.

Data can be stored in or deleted from a flash memory device through a program operation or an erase operation. The flash memory device can be classified as a NOR type or a NAND type depending on the shape of a memory cell array. The NAND flash memory device is advantageous in that it can have a high level of integration compared with the NOR flash memory device. A memory cell array of the NAND flash memory device and a program operation method are described below.

FIG. 1 is a circuit diagram illustrating a cell array of a conventional NAND flash memory device and a program operation method thereof.

Referring to FIG. 1, the cell array of the NAND flash memory device includes a plurality of memory cell blocks. Each cell block includes a plurality of cell strings (only two cell strings ST1 and ST2 are illustrated for convenience). The cell strings are respectively connected to bit lines BL1 and BL2. In more detail, the cell string ST1 has a structure in which a drain select transistor DST, a plurality of memory cells CA0 to CAn, and a source select transistor SST are connected in series. The drain select transistor DST, included in each cell string, has a drain connected to a corresponding bit line BL1, and the source select transistor SST, included in each cell string, has a source connected to a common source line CSL. The drain select transistors DST, included in the respective cell strings ST1 and ST2, have gates connected to each other, thereby forming a drain select line DSL. The source select transistors SST, included in the respective cell strings ST1 and ST2, have gates connected to each other, thereby forming a source select line SSL. The memory cells CA0 to CAn and CB0 to CBn have gates connected to each other, thereby forming word lines WL0 to WLn. The memory cells CAk and CBk, which share a word line (for example, WLk), are classified on a per page (PG) basis.

A program operation of the NAND flash memory device is executed on a per page basis. During the program operation, the drain select line DSL is supplied with a drain select voltage, for example a power supply voltage Vcc, and the source select line SSL is supplied with a ground voltage. A program voltage is applied to a selected word line (for example WLk), and a pass voltage is applied to the remaining word lines. Under the above conditions, the program operation of memory cells sharing the selected word line WLk is executed.

The threshold voltage of a memory cell is raised by the program operation, and a logical value of stored data is classified according to the changed threshold voltage of the memory cell.

Although both the memory cells CAk and CBk sharing the selected word line WLk can be programmed, under certain circumstances both the memory cells CAk and CBk sharing the selected word line WLk may not be programmed according to stored data. Different voltages are applied to bit lines connected to a corresponding string depending on which one of a to-be-programmed cell and a not-to-be-programmed cell is included in the string (a cell in which an erase state or a previous state is to be maintained). A cell that should not be programmed is hereinafter referred to as a "program-inhibited cell."

Specifically, a ground voltage is applied to a bit line BL1 connected to the string ST1, including a to-be-programmed cell (for example, CAk). The ground voltage causes the voltage level of a channel region within the string ST1 to drop to the level of the ground voltage. Consequently, a high potential is maintained between the word line WLk and the channel region, and electrons are injected from the channel region to a floating gate of the memory cell CAk by F-N tunneling, so that the threshold voltage of the memory cell is raised. Accordingly, the program operation is executed.

A program-inhibited voltage (for example, a power supply voltage Vcc) for channel boosting is applied to a bit line BL2 connected to the string ST2, including a program-inhibited cell (for example, CBk). The power supply voltage causes the channel region within the string ST2 to be precharged to a level higher than 0V (Vcc-Vth, where V is the threshold voltage of the drain select transistor). If the channel region is precharged, the drain select transistor DST is turned off and the channel region of the string ST2, including the program-inhibited cell CBk, is floated in a precharged state because Vgs (the potential between the gate and the source) of the drain select transistor DST is not greater than the threshold voltage. If a pass voltage and a program voltage are then applied to the word lines WL0 to WLk, the voltage level of the channel region is raised higher than that of the power supply voltage due to a channel boosting phenomenon. Consequently, the potential between the word line WLk and the channel region decreases, so that F-N tunneling is not generated and the threshold voltage of the memory cell is not changed. Accordingly, the program-inhibited cell does not experience the program operation. In this case, the greater the difference between the voltage applied to the word line and the voltage of the channel region, the better the channel boosting characteristic.

A program method of storing 2-bit data or more in one memory cell has recently been developed. In order to store 2-bit data in one memory cell, threshold voltage distributions of the memory cell must be classified into four types and at least two program operations must be executed on one memory cell.

In the event that data stored in a memory cell of an erase state is defined as '11', a first program operation for changing a lower bit to '0' and a second program operation for changing an upper bit to '0' must be executed. The first and second program operations are generally performed sequentially from the first word line WL0 to the last word line WLn.

When the program operation of the memory cells CAk and CBk, sharing a $k^{th}$ word line WLk, is executed according to the above method, the memory cells CB0 to CBk−1 disposed on the source select transistor (SST) side have already experienced the program operation. The cells are classified into a program state or an erase state according to stored data. A memory cell CBk+1 disposed on the drain select transistor (DST) side has not experienced the program operation, and is therefore maintained at an erase state. If a larger number of programmed cells exist on the source select transistor (SST) side, the potential between the word line and the channel region decreases due to electrons injected into the floating gate, so that a weak channel boosting phenomenon may occur. Thus, if the number of programmed cells varies for every string, channel boosting occurs with different intensities, which may result in a changed program characteristic. This phenomenon may happen not only in the program operation for storing 2-bit data, but also in a program method of storing 1-bit data.

In order to prevent this phenomenon, the program operation can be performed by using an erase area self-boosting (EASB) method of generating channel boosting only in a channel region of memory cells, which are maintained at an erase state while being placed on the drain select transistor (DST) side in the selected word line WLk. Alternatively, the program operation can be performed by using a local self-boosting (LSB) method of generating channel boosting only in a channel region of memory cells, which share the selected word line WLk by turning off the memory cells WLk−1 and WLk+1 adjacent to the selected word line WLk.

The program operation of the EASB method or the LSB method can have a good effect when memory cells disposed between the selected word line WLk and the drain select line DSL are in an erase state. However, in order to minimize an interference phenomenon in which the threshold voltage of neighboring memory cells is changed during a program operation of memory cells sharing a selected word line, the sequence of the first and second program operations or the sequence of word lines is changed. In this case, since programmed cells may exist between the selected word line WLk and the drain select line DSL, it is difficult to obtain good program characteristics even with the program operation of the EASB method or the LSB method. In particular, in the program operation of the LSB method, if a program voltage is applied, hot electrons generated from junction regions of memory cells that are turned off on both sides of the selected word line WLk are injected into the floating gate of the program-inhibited cell CBk according to the program voltage, resulting in a program disturbance phenomenon in which the threshold voltage rises.

Consequently, in order to obtain good program characteristics while preventing program disturbance, it is very important to control the occurrence of channel boosting within a string including program-inhibited cells.

BRIEF SUMMARY OF THE INVENTION

According to the present invention, in the state where all memory cells within a string are turned on to electrically connect channel regions, all of the channel regions within a second string are precharged uniformly by applying a ground voltage to a first bit line connected to a first string including to-be-programmed cells and a program-inhibited voltage to a second bit line connected to the second string including program-inhibited cells. If a program operation is executed, channel boosting occurs in the channel regions within the second string including the program-inhibited cells. Accordingly, a channel boosting potential can be increased and a program disturbance phenomenon in which the threshold voltage of program-inhibited cells is changed can be prevented.

A program method of a flash memory device according to a first embodiment of the present invention includes providing a memory device comprising a drain select line, a source select line, and word lines, and having a string connected between a bit line and a common source line; applying a program-inhibited voltage in a state where channel regions within the string are not electrically connected to the bit line; applying a pass voltage to the word lines; applying a drain select voltage to the drain select line; and executing a program operation by applying a program voltage higher than the pass voltage to a selected one of the word lines.

A program method of a flash memory device according to a second embodiment of the present invention includes providing a memory device comprising a drain select line, a source select line, and word lines, and having strings respectively connected between bit lines and a common source line; in a state where channel regions within the string are not electrically connected to the bit lines, applying a ground voltage to a first bit line connected to a first string including a to-be programmed memory cell and applying a program-inhibited voltage to a second bit line connected to a second string including a program-inhibited cell; applying a pass voltage to the word lines; applying a drain select voltage to the drain select line; and executing a program operation by applying a program voltage higher than the pass voltage to a selected one of the word lines.

Memory cells that share the word lines may be all turned on according to the pass voltage irrespective of a program state. During execution of the program operation, a level of the pass voltage applied to the selected word line may rise to a level of the program voltage. A drain select transistor included in the first string may be turned on according to the drain select voltage, so that channel regions within the first string may be electrically connected to the first bit line.

A program method of a flash memory device according to a third embodiment of the present invention includes providing a memory device comprising a drain select line, a source select line, and word lines, and having a string connected between a bit line and a common source line; applying a program-inhibited voltage to the bit line in a floating state where channel regions within the string are not electrically connected to the bit line; electrically connecting the channel regions in a state where the channel regions are not electrically connected to the bit line; applying a drain select voltage to the drain select line; and executing a program operation by applying a program voltage higher than a pass voltage to a selected one of the word lines.

The channel regions may be connected according to the pass voltage applied to each of the word lines. When the channel regions are connected according to the pass voltage, a channel boosting phenomenon may be generated and a voltage of the channel regions may rise. The program-inhibited voltage may be applied earlier than the pass voltage, the pass voltage may be applied earlier than the program-inhibited voltage, or the pass voltage and the program-inhibited voltage may be applied at the same time. The drain select voltage may be applied after the program-inhibited voltage and the pass voltage are applied.

A program method of a flash memory device according to a fourth embodiment of the present invention includes providing a memory device comprising a drain select line, a source select line, and word lines, and having strings respectively connected between bit lines and a common source line; in a floating state where channel regions within the string are not electrically connected to the bit lines, applying a ground voltage to a first bit line connected to a first string including a to-be programmed memory cell and applying a program-inhibited voltage to a second bit line connected to a second string including a program-inhibited cell; in a state where the channel regions are not connected to the bit lines, electrically connecting first channel regions of memory cells, included in the first string, and second channel regions of memory cells, included in the second string, respectively; in a state where the first and second channel regions are connected to each other, electrically connecting the first channel regions to the first bit line; and executing a program operation so that a threshold voltage of the to-be programmed memory cell rises.

The first channel regions may be connected to each other according to a pass voltage applied to each of the word lines, and the second channel regions may be connected to each other according to the pass voltage applied to each of the word lines. Since a channel boosting phenomenon is generated in each of the first and second channel regions by the pass voltage, a voltage of the first and second channel regions may rise. The first channel regions may be connected to the first bit line as a drain select transistor of the first string is turned on according to a drain select voltage applied to the drain select line. The drain select voltage may have the same level as that of the program-inhibited voltage. The program-inhibited voltage may be applied before the first and second channel regions are connected to each other, the program-inhibited voltage may be applied after the first and second channel regions are connected to each other, or the first and second channel regions may be connected to each other at the same time when the program-inhibited voltage is applied. After the first and second channel regions are connected to each other and the program-inhibited voltage is applied, the first channel regions may be electrically connected to the first bit line. In the application of the program-inhibited voltage, a source select voltage for turning off a source select transistor may be applied to the source select line, and a positive voltage may be applied to a common source line.

A program method of a flash memory device according to a fifth embodiment of the present invention includes providing a memory device comprising a drain select line, a source select line, and word lines, and having a string connected between a bit line and a common source line; applying a ground voltage to the bit line and a first voltage to the drain select line; applying a second voltage to the word lines so that memory cells are turned on; applying a pass voltage higher than the second voltage to the word lines while applying a program-inhibited voltage to the bit line; and executing a program operation by applying a program voltage higher than the pass voltage to a selected one of the word lines.

A program method of a flash memory device according to a sixth embodiment of the present invention includes providing a memory device comprising a drain select line, a source select line, and word lines, and having strings respectively connected between bit lines and a common source line; applying a ground voltage to the bit lines and a first voltage to the drain select line; applying a second voltage to the word lines so that memory cells are turned on; applying a pass voltage higher than the second voltage to the word lines, a ground voltage to a first bit line connected to a first string including a to-be programmed memory cell, and a program-inhibited voltage to a second bit line connected to a second string including a program-inhibited cell; and executing a program operation by applying a program voltage higher than the pass voltage to a selected one of the word lines.

The memory cells may be all turned on according to the second voltage irrespective of a program state or an erase state. During execution of the program operation, a level of the pass voltage applied to the selected word line may rise to a level of the program voltage.

A drain select transistor included in the first string may be turned on according to the first voltage applied to the drain select line, so that channel regions within the first string may be electrically connected to the first bit line. Channel regions within the string may be electrically connected to one another according to the second voltage. The channel regions within the string may be disposed in a semiconductor substrate between the source select line and the drain select line, or in a semiconductor substrate under the word lines.

A program method of a flash memory device according to a seventh embodiment of the present invention includes providing a memory device comprising a drain select line, a source select line, and word lines, and having a string connected between a bit line and a common source line; applying a ground voltage to the bit line and a first voltage to the drain select line; electrically connecting channel regions within the string; generating a channel boosting phenomenon in the channel regions, thereby raising a potential of the channel regions; and executing a program operation by applying a program voltage to a selected one of the word lines.

The channel regions may be connected to one another when memory cells that share the word lines are turned on according to a second voltage applied to the word lines. The potential of the channel regions may rise in proportion to a value in which a voltage applied to the word lines rises as a drain select transistor that shares the drain select line is turned off according to a program-inhibited voltage applied to the bit line and the channel regions enter a floating state.

A program method of a flash memory device according to an eighth embodiment of the present invention includes providing a memory device comprising a drain select line, a source select line, and word lines, and having strings connected between bit lines and a common source line; applying a ground voltage to the bit lines and a first voltage to the drain select line; connecting first channel regions of a first string of the strings, which includes a to-be programmed memory cell, and second channel regions of a second string of the strings, which includes a program-inhibited cell; applying a ground voltage to the first channel regions of the first string and generating a channel boosting phenomenon in the second channel regions of the second string, thereby raising a potential of the second channel regions; and executing a program operation by applying a program voltage to a selected one of the word lines.

Memory cells that share the word lines may be turned on according to a second voltage applied to the word lines, so that the first channel regions and the second channel regions are connected to each other. While a drain select transistor of the first string that shares the drain select line is turned on, the first channel regions may be electrically connected to the first bit line, so that the ground voltage is applied to the first channel regions. The potential of the channel regions may rise in proportion to a value in which a voltage applied to the word lines rises as a drain select transistor of the second string that shares the drain select line is turned off according to a program-inhibited voltage applied to the second bit line and the channel regions enter a floating state. During the application of the first voltage to the drain select line, a source select voltage may be applied to the source select line so that a source select transistor is turned off and a positive voltage is applied to a common source line. The channel regions within the string may be disposed in a semiconductor substrate between the source select line and the drain select line.

According to the present invention, in the state where all of the memory cells within a string are turned on, a program-inhibited voltage is applied to a bit line. Accordingly, all of the channel regions within the string can be precharged uniformly.

Further, channel boosting is generated in the state where the channel regions are precharged uniformly. Accordingly, a channel boosting potential can be increased and the occurrence of program disturbance can be minimized.

The present invention can also be applied to a case where the sequence of program operations or word lines is changed in order to prevent a variation in the threshold voltage of neighboring cells due to an interference phenomenon during a program operation. In particular, the present invention can also be applied to a case where memory cells located between a selected word line and a drain select line have been programmed.

Further, channel boosting is generated not only in a channel region within a string, but also in the entire channel region. It is therefore possible to prevent the threshold voltage of program-inhibited cells from being changed due to hot electrons when channel boosting occurs in some regions.

BRIEF DESCRIPTION OF THE DRAWINGS

FIG. 6 is a waveform illustrating a program method of a flash memory device according to a second embodiment of the present invention;

FIG. 7 is a waveform illustrating a program method of a flash memory device according to a third embodiment of the present invention; and FIG. 8 is a waveform illustrating a program method of a flash memory device according to a fourth embodiment of the present invention.

DESCRIPTION OF SPECIFIC EMBODIMENTS

Specific embodiments according to the present invention will be described with reference to the accompanying drawings.

Figure 2:
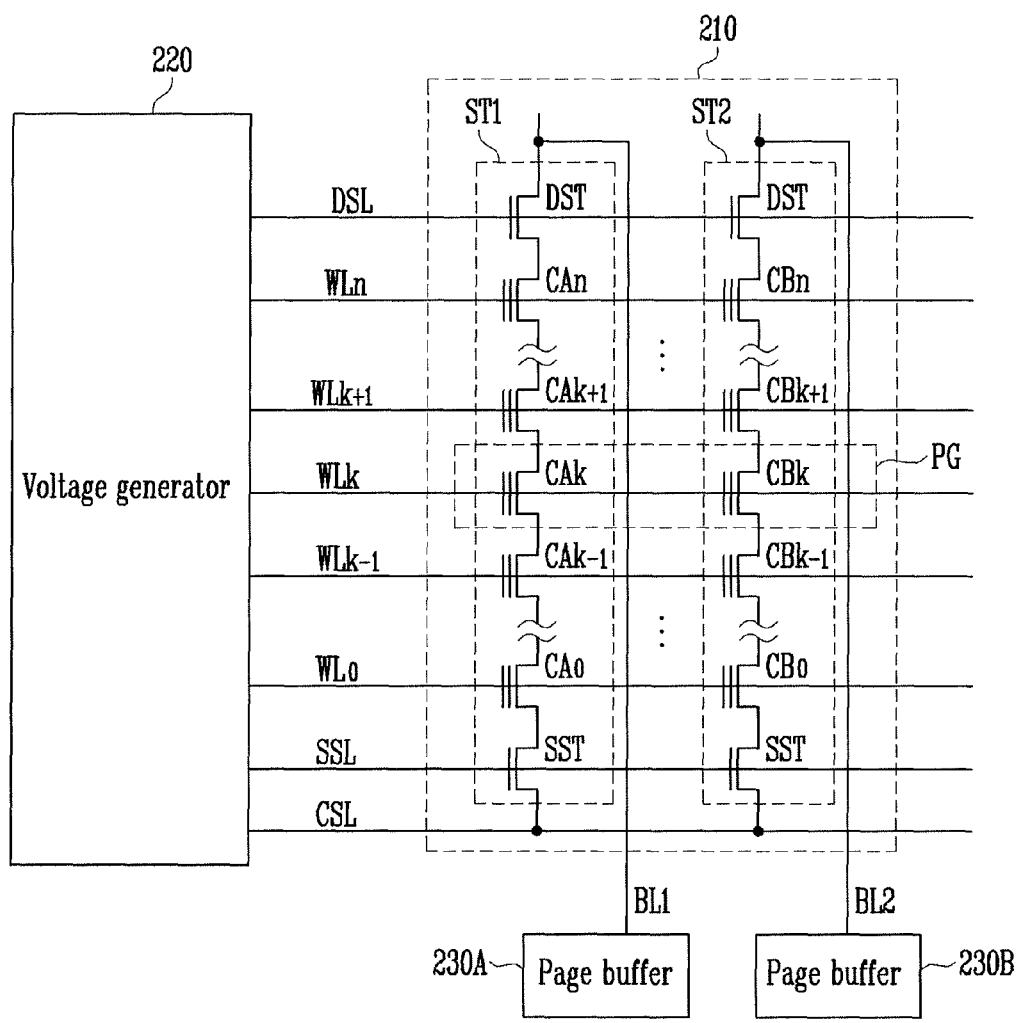
FIG. 2 is a circuit diagram illustrating a program method of a flash memory device according to an embodiment of the present invention.
Figure 3:
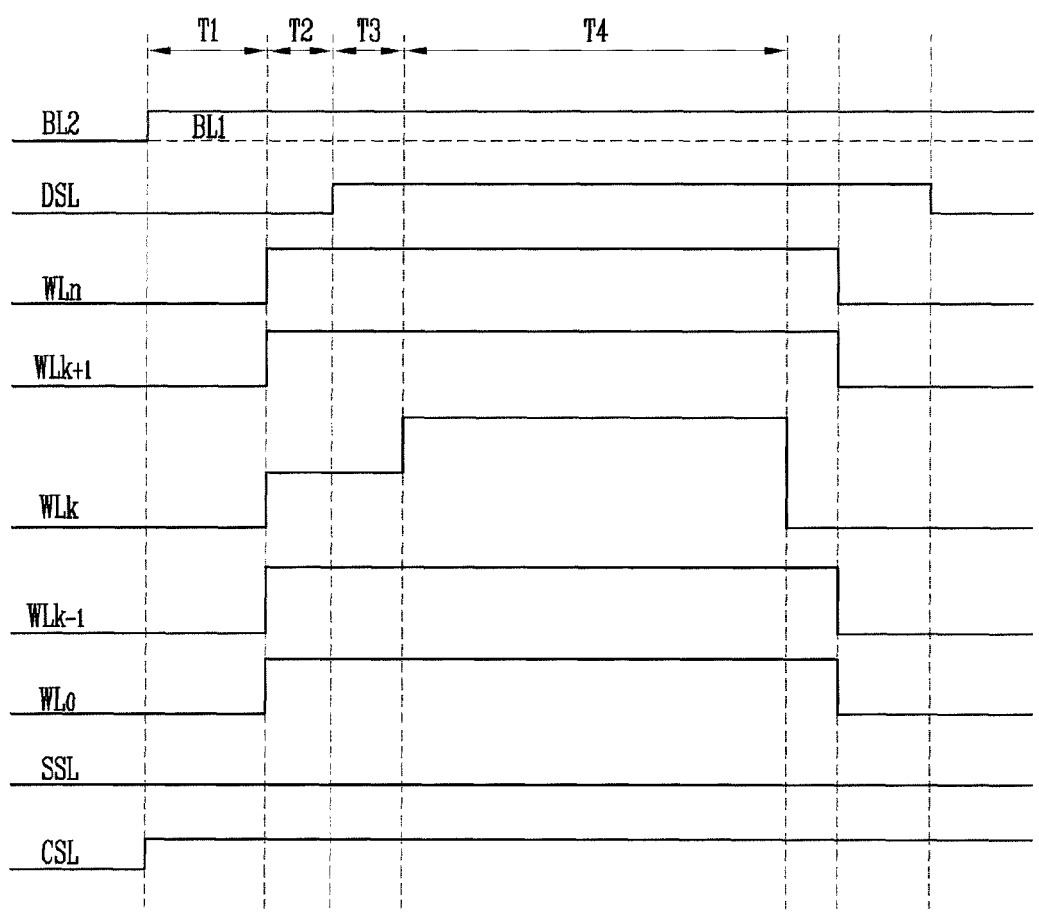
FIG. 3 is a waveform illustrating a program method of a flash memory device according to a first embodiment of the present invention.
Figure 4:
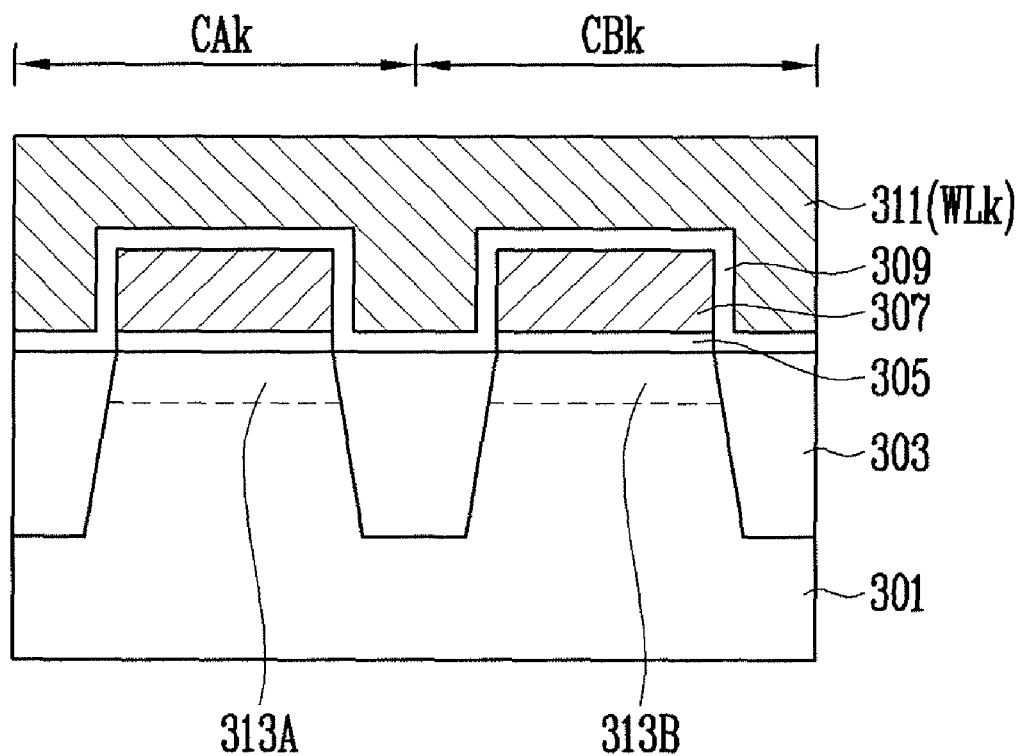
FIG. 4 is a cross-sectional view of memory cells CAk, CBk that share a $k^{th}$ word line in the circuit diagram of FIG. 2.

FIG. 2 is a circuit diagram illustrating a program method of a flash memory device according to an embodiment of the present invention. FIG. 3 is a waveform illustrating a program method of a flash memory device according to a first embodiment of the present invention. FIG. 4 is a cross-sectional view of memory cells CAk, CBk that share a $k^{th}$ word line in the circuit diagram of FIG. 2.

Figure 1:
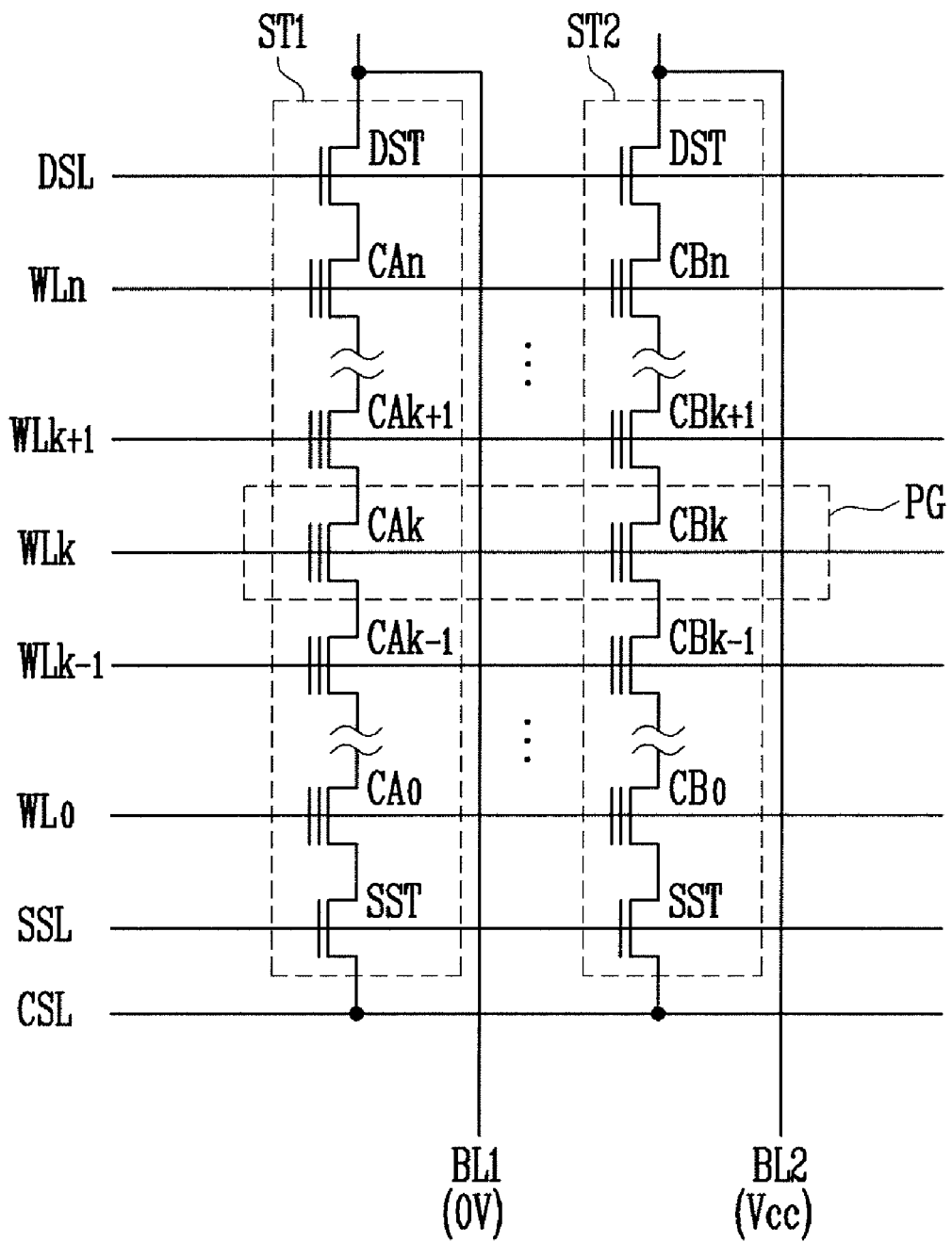
FIG. 1 is a circuit diagram illustrating a cell array of a conventional NAND flash memory device and a program operation method thereof.
Figure 5A:
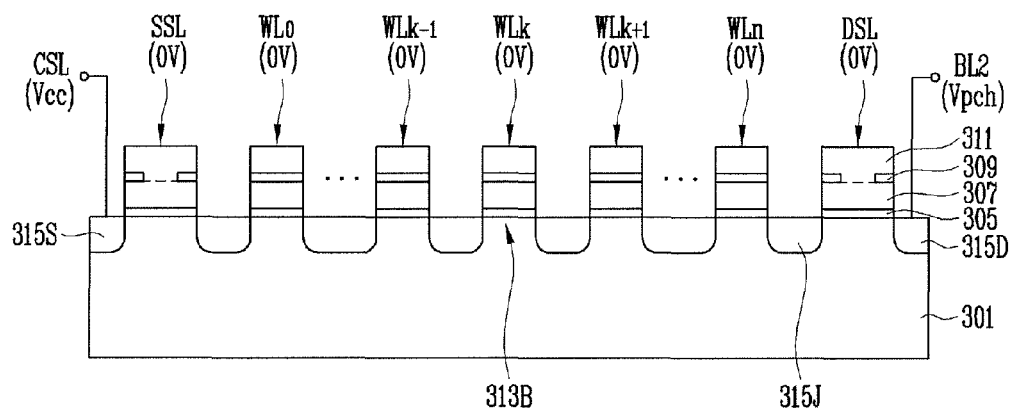
FIGS. 5A to 5D are cross-sectional views of a string in the circuit diagram of FIG. 2.

Referring to FIG. 2, the flash memory device according to an embodiment of the present invention includes a memory cell array 210, a voltage generator 220, and page buffers 230A and 230B. The memory cell array 210 includes a plurality of blocks, each of which includes a plurality of strings (only two cell strings ST1 and ST2 are illustrated for convenience). As shown in FIGS. 4 and 5A, a word line and a select line include tunnel insulating layers 305, a floating gate 307, dielectric layers 309, and a control gate 311; all of which are stacked over a semiconductor substrate 301. Two select lines SSL and DSL are connected to the floating gate 307 and the control gate 311 since a hole is formed in the dielectric layer 309. Junction regions 315J are formed in the semiconductor substrate 301 between the word lines and the select lines. A bit line BL1 is connected to a source 315S formed at one side of a common source line CSL. A bit line BL2 is connected to a drain 315D of the drain select line DSL. The memory cell array 210 has the same memory cell array structure as that of FIG. 1, and a description thereof will be omitted for simplicity.

Referring back to FIG. 2, the voltage generator 220 supplies operating voltages, necessary for a program operation, to the drain select line DSL, word lines WL0 to WLn, and the source select line SSL. Page buffers 230A and 230B are respectively connected to the drains of drain select transistors DST included in the strings ST1 and ST2 through the bit lines BL1 and BL2. The page buffers 230A and 230B apply a program-inhibited voltage (for example, a power supply voltage) or a ground voltage to the bit lines according to externally input data.

A program operation when a memory cell CAk of memory cells CAk and CBk, which share a $k^{th}$ word line WLk, is a to-be-programmed cell and the memory cell CBk is a program-inhibited cell that should be maintained at a previous state, is described below.

Referring to FIGS. 3, 4, and 5A, in a first period T1, a program-inhibited voltage or a ground voltage is applied to the bit lines BL1 and BL2 according to externally input data. The ground voltage is applied to the first bit line BL1 connected to the first string ST1 including the first memory cell CAk to be programmed, and a program-inhibited voltage Vpch is applied to the second bit line BL2 connected to the second string ST2 including the second memory cell CBk (that is, a program-inhibited cell). A power supply voltage is applied to the common source line CSL and the ground voltage is applied to the source select line SSL. Since the ground voltage is applied to the drain select line DSL, the program-inhibited voltage Vpch is not transferred to a second channel region 313B within the second string ST2. That is, even if the program-inhibited voltage Vpch is applied, the second channel region 313B of the second string ST2 is not precharged.

Figure 5B:
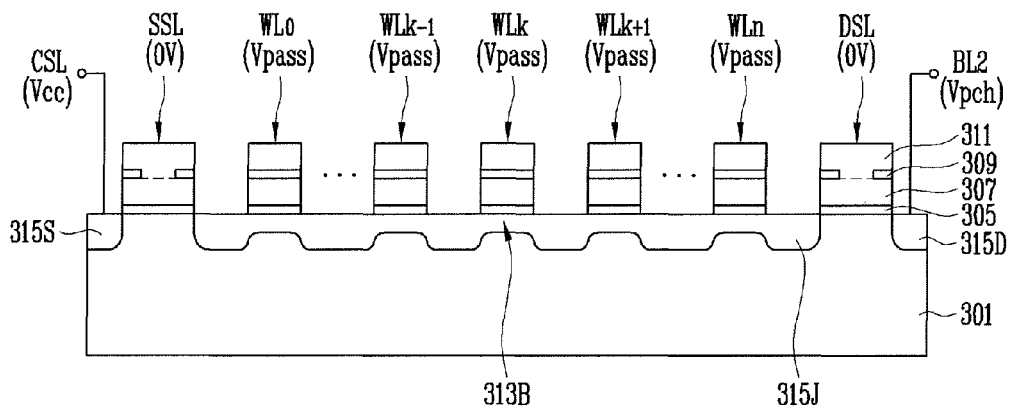

Referring to FIGS. 3, 4, and 5B, in a second period T2, a pass voltage Vpass is applied to the word lines WL0 to WLn so that all of the memory cells CA0 to CAn and CB0 to CBn, which are included in a block selected at the time of a program operation, are turned on. The pass voltage Vpass refers to a voltage, which is applied to turn on memory cells connected to an unselected word line during a general program operation. As the pass voltage Vpass is applied to the word lines WL0 to WLn, all of the memory cells CA0 to CAn and CB0 to CBn are turned on, and all of the channel regions are electrically connected to the semiconductor substrate 301 between the source select line SSL and the drain select line DSL within each of the strings ST1 and ST2. Since the drain select line DSL and the source select line SSL are supplied with the ground voltage and the drain select transistor DST and the source select transistor SST are in a turn-off state, the first and second channel regions 313A and 313B of the strings ST1 and ST2 are supplied with the pass voltage Vpass in a floating state. Accordingly, a boosting phenomenon occurs in the strings ST1 and ST2 due to a capacitance coupling phenomenon, so that the voltage levels of the first and second channel regions 313A and 313B rise.

Although programmed cells exist in the second string ST2 including the program-inhibited cell CBk, all of the memory cells CB0 to CBn are turned on to connect the channel regions. Thus, after a boosting phenomenon is generated, a uniform potential can be maintained in the second channel region 313B within the second string ST2 irrespective of the programmed cells.

Figure 5C:
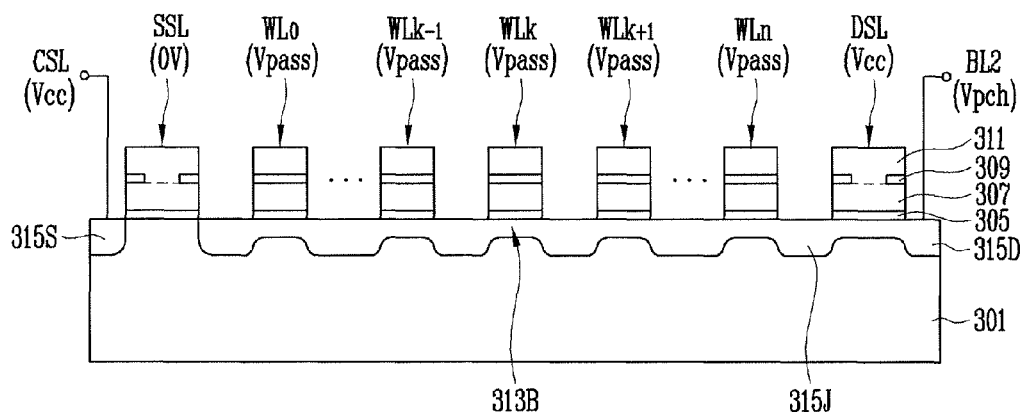

Referring to FIGS. 3, 4, and 5C, in a third period T3, a drain select voltage is applied to the drain select line DSL. The drain select voltage applied to the drain select line DSL may have the same level as that of the program-inhibited voltage applied to the second bit line BL2. If the drain select voltage is applied to the drain select line DSL, the drain select transistor DST of the first string ST1 is turned on and, therefore, the first bit line BL1 applied to the ground voltage is electrically connected to the first channel region 313A of the first string ST1. Thus, the voltage level of the first channel region 313A of the first string ST1 drops to the level of the ground voltage. Although the drain select voltage is applied to the drain select line DSL in the second string ST2, the drain select transistor DST is not turned on due to a difference between Vgs (the potential between the gate and the source) and Vth (the threshold voltage of the drain select transistor). The second channel region 313B of the second string ST2 is kept at a voltage level, which is raised by a boosting phenomenon. If the boosted voltage level of the second channel region 313B is lower than the program-inhibited voltage, the drain select transistor DST of the second string ST2 is turned on and the second channel region of the second string ST2 is precharged to a predetermined level (i.e., the program-inhibited voltage which is the threshold voltage of the drain select transistor). The drain select transistor DST is then turned off.

Figure 5D:
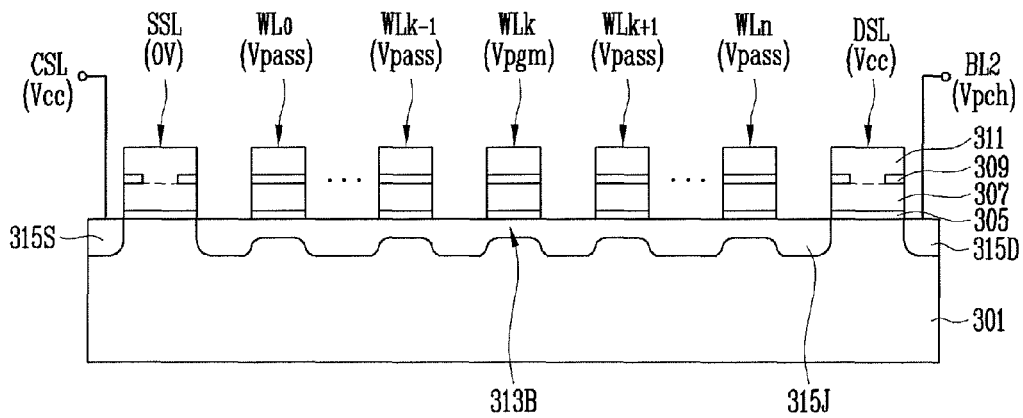

Referring to FIGS. 3, 4, and 5D, in a fourth period T4, a program operation is performed by applying a program voltage Vpgm to a selected word line WLk. In the first string ST1, electrons are injected from the first channel region 313A to the floating gate 307 of the memory cell CAk due to the potential between the word line WLk of the memory cell CAk and the first channel region 313A, so that the threshold voltage rises. Consequently, the memory cell CAk is programmed.

The program voltage Vpgm is applied in the state where the drain select transistor DST of the second string ST2 is turned off and the second channel region 313B of the second string ST2 is floated. Thus, a boosting phenomenon occurs in the second channel region 313B of the second string ST2 due to the program voltage Vpgm, and the voltage of the second channel region 313B rises additionally. As a result, since the potential between the word line WLk of the program-inhibited cell CBk and the second channel region 313B further decreases, the program-inhibited cell CBk is not programmed and a program disturbance phenomenon is not generated.

After the program voltage Vpgm is applied for a time sufficient to program the memory cell CAk, the supply of the program voltage Vpgm applied for the program operation, the pass voltage Vpass, and the drain select voltage applied to the drain select line DSL is stopped in the remaining periods. The supply of the program voltage Vpgm, the pass voltage Vpass, and the drain select voltage may be stopped sequentially. Though not shown in the drawing, the supply of the program-inhibited voltage Vpch and the voltage of the common source line CSL is also stopped.

After the program operation is performed, a program verification operation for verifying whether the threshold voltage of the memory cell CAk has risen to a target voltage is performed. If, as a result of the verification, the threshold voltage of the memory cell CAk has risen to the target voltage, the program operation is finished. However, if, as a result of the verification, the threshold voltage has not risen to the target voltage, the program operation is performed again according to the above method while raising the level of the program voltage Vpgm step-by-step until the threshold voltage becomes the same as or higher than the target voltage.

It has been described above that before the drain select voltage is applied to the drain select line DSL, that is, the channel regions within the string are electrically connected to the bit line, the program-inhibited voltage is applied to the bit line before the pass voltage. However, the program-inhibited voltage may be applied to the bit line in various ways.

FIG. 6 is a waveform illustrating a program method of a flash memory device according to a second embodiment of the present invention.

Referring to FIG. 6, in the program method of the flash memory device according to the second embodiment of the present patent, before the drain select voltage is applied to the drain select line DSL, the pass voltage is applied to the word lines WL0 to WLn before the program-inhibited voltage. Even in this case, a channel boosting phenomenon described with reference to FIG. 3 can be generated uniformly.

Although it has been described that the program-inhibited voltage is applied before the drain select voltage, the program-inhibited voltage and the drain select voltage may be applied at the same time.

FIG. 7 is a waveform illustrating a program method of a flash memory device according to a third embodiment of the present invention.

Referring to FIG. 7, in the program method of the flash memory device according to the third embodiment of the present invention, before the drain select voltage is applied to the drain select line DSL, the pass voltage and the program-inhibited voltage may be applied to the word lines WL0 to WLn and the bit line, respectively, at the same time. In this case, a channel boosting phenomenon described with reference to FIG. 3 can also be generated uniformly.

It has been described above, with reference to FIGS. 6 and 7, that the pass voltage is applied simultaneously with a positive voltage applied to the common source line CSL. However, the pass voltage may be applied before the positive voltage of the common source line CSL.

FIG. 8 is a waveform illustrating a program method of a flash memory device according to a fourth embodiment of the present invention.

Referring to FIGS. 2, 4, and 8, in a first period T1, a first voltage for turning on the drain select transistor DST is applied to the drain select line DSL, and a ground voltage is applied to the bit lines BL1 and BL2 and the word lines WL0 to WLn. Even though the drain select transistor DST is turned on, the channel regions 313A and 313B are not precharged because the ground voltage is applied to the bit lines BL1 and BL2.

The source select voltage of, for example, 0V may be applied to the source select line SSL so that the source select transistor SST is turned off. Further, although the source select transistor SST is turned off, the leakage current to the common source line CSL can be generated. Accordingly, a common source voltage may be applied to the common source line CSL and the power supply voltage Vcc.

In a second period T2, a second voltage is applied to the word lines WL0 to WLn so that the memory cells CA0 to CAn and CB0 to CBk are turned on irrespective of a program state. If the memory cells CA0 to CAn and CB0 to CBk are turned on in the state where the drain select transistor DST is turned on and the ground voltage is applied to the bit lines BL1 and BL2, the ground voltage is applied to the first channel region 313A of the first string ST1 and the second channel region 313B of the second string ST2.

In a third period T3, the program-inhibited voltage Vpch or the ground voltage is applied to the bit lines BL1 and BL2 according to externally input data. The ground voltage is applied to the first bit line BL1 connected to the first string ST1 including the first memory cell CAk that is to be programmed, and the program-inhibited voltage Vpch is applied to the second bit line BL2 connected to the second string ST2 including the second memory cell CBk (i.e., a program-inhibited cell). The pass voltage Vpass higher than the second voltage is applied to the word lines WL0 to WLn. In the second string ST2, the second channel region 313B is precharged to a level as much as Vpch-Vth (the threshold voltage of the drain select transistor) according to the program-inhibited voltage Vpch applied through the second bit line BL2. Since the second channel region 313B is precharged, the drain select transistor DST is turned off, so that the second channel region 313B enters a floating state. Further, since a boosting phenomenon is generated in response to the pass voltage Vpass, the voltage of the second channel region 313B rises. The second voltage applied to the word lines WL0 to WLn in the second period T2 causes all of the memory cells CB0 to CBn to turn on, thereby connecting the channel regions 313B of the memory cells CB0 to CBn. Accordingly, a boosting phenomenon is generated uniformly in the channel regions 313B of the memory cells CB0 to CBn according to the pass voltage Vpass irrespective of a program state.

In a fourth period T4, a program operation is performed by applying the program voltage Vpgm to the selected word line WLk. In the first string ST1, electrons are injected from the first channel region 313A to the floating gate 307 of the memory cell CAk due to the potential between the word line WLk of the memory cell CAk and the first channel region 313A, so that the threshold voltage rises. Consequently, the memory cell CAk is programmed.

The program voltage Vpgm is applied in the state where the drain select transistor DST of the second string ST2 is turned off and the second channel region 313B of the second string ST2 is floated. Thus, a boosting phenomenon occurs additionally in the second channel region 313B of the second string ST2 according to the program voltage Vpgm, so that the voltage of the second channel region 313B rises incidentally. Accordingly, the potential between the word line WLk of the program-inhibited cell CBk and the second channel region 313B further decreases. Consequently, the program-inhibited cell CBk is not programmed and a program disturbance phenomenon is not generated.

After the program voltage Vpgm is applied for a time sufficient to program the memory cell CAk, the supply of the program voltage Vpgm for the program operation, the pass voltage Vpass, and the drain select voltage applied for the drain select line DSL is stopped in the remaining periods. The supply of the voltages may be stopped sequentially. Though not shown in the drawing, the supply of the program-inhibited voltage Vpch and the voltage applied to the common source line CSL is also stopped.

After the program operation is performed, a program verification operation for verifying whether the threshold voltage of the memory cell CAk has risen to a target voltage is performed. If, as a result of the verification, the threshold voltage of the memory cell CAk has risen to the target voltage, the program operation is finished. However, if, as a result of the verification, the threshold voltage has not risen to the target voltage, the program operation is performed again according to the above method while raising the level of the program voltage Vpgm step-by-step until the threshold voltage becomes the same as or higher than the target voltage.

The above program method is compared with the prior art below. In the prior art, since the pass voltage or the program voltage is applied in the state where the channel region within the string is locally precharged by the program-inhibited voltage, a boosting phenomenon is generated irregularly according to a program state of memory cells within the same string. However, in the present invention, since a voltage rises uniformly due to a boosting phenomenon in the whole channel regions of a string including the program-inhibited cell, the occurrence of a program disturbance phenomenon can be prevented effectively.

Although the foregoing description has been made with reference to specific embodiments, it is to be understood that changes and modifications of the present invention may be made by one ordinary skilled in the art without departing from the spirit and scope of the present invention and appended claims.

What is claimed is:

1. A program method of a flash memory device, the program method comprising:
   providing a memory device comprising a drain select line, a source select line, and word lines, and having a string connected between a bit line and a common source line;
   applying a program-inhibited voltage in a state where channel regions within the string are not electrically connected to the bit line;
   applying a pass voltage to the word lines after applying the program-inhibited voltage;
   applying a drain select voltage to the drain select line after applying the pass voltage; and
   executing a program operation by applying a program voltage higher than the pass voltage to a selected one of the word lines after applying the drain select voltage.

2. The program method of claim 1, wherein memory cells that share the word lines are turned on according to the pass voltage irrespective of a program state.

3. The program method of claim 1, wherein during execution of the program operation, a value of the pass voltage applied to the selected word line rises to a value of the program voltage.

4. The program method of claim 1, wherein the drain select voltage has substantially the same value as that of the program-inhibited voltage.

5. The program method of claim 1, wherein during application of the program-inhibited voltage, a source select voltage for turning off a source select transistor is applied to the source select line, and a positive voltage is applied to a common source line.

6. The program method of claim 1, wherein the channel regions within the string are disposed in a semiconductor substrate between the source select line and the drain select line.

7. The program method of claim 1, wherein the channel regions within the string are disposed in a semiconductor substrate under the word lines.

8. A program method of a flash memory device, the program method comprising:
   providing a memory device comprising a drain select line, a source select line, and word lines, and having strings respectively connected between bit lines and a common source line;
   in a state where channel regions within the string are not electrically connected to the bit lines, applying a ground voltage to a first bit line connected to a first string including a to-be programmed memory cell and applying a program-inhibited voltage to a second bit line connected to a second string including a program-inhibited cell;
   applying a pass voltage to the word lines after applying the program-inhibited voltage;

applying a drain select voltage to the drain select line after applying the pass voltage; and executing a program operation by applying a program voltage higher than the pass voltage to a selected one of the word lines after applying the drain select voltage.

9. The program method of claim 8, wherein memory cells that share the word lines are turned on according to the pass voltage irrespective of a program state.

10. The program method of claim 8, wherein during execution of the program operation, a value of the pass voltage applied to the selected word line rises to a value of the program voltage.

11. The program method of claim 8, wherein a drain select transistor included in the first string is turned on according to the drain select voltage, so that channel regions within the first string are electrically connected to the first bit line.

12. The program method of claim 8, wherein the drain select voltage has the same value as that of the program-inhibited voltage.

13. The program method of claim 8, wherein during application of the program-inhibited voltage, a source select voltage for turning off a source select transistor is applied to the source select line, and a positive voltage is applied to a common source line.

14. The program method of claim 8, wherein the channel regions within the string are disposed in a semiconductor substrate between the source select line and the drain select line.

15. The program method of claim 8, wherein the channel regions within the string are disposed in a semiconductor substrate under the word lines.

16. A program method of a flash memory device, the program method comprising:

providing a memory device comprising a drain select line, a source select line, and word lines, and having a string connected between a bit line and a common source line;

applying a program-inhibited voltage to the bit line in a floating state where channel regions within the string are not electrically connected to the bit line;

electrically connecting the channel regions in a state where the channel regions are not electrically connected to the bit line after applying the program-inhibited voltage;

applying a drain select voltage to the drain select line after electrically connecting the channel regions; and executing a program operation by applying a program voltage higher than a pass voltage to a selected one of the word lines after applying the drain select voltage.

17. The program method of claim 16, wherein the channel regions are connected according to the pass voltage applied to each of the word lines.

18. The program method of claim 17, wherein as the channel regions are connected according to the pass voltage, a channel boosting phenomenon is generated and a voltage of the channel regions rises.

19. The program method of claim 16, wherein during application of the program-inhibited voltage, a source select voltage for turning off a source select transistor is applied to the source select line, and a positive voltage is applied to a common source line.

20. The program method of claim 16, wherein the channel regions within the string are disposed in a semiconductor substrate between the source select line and the drain select line.

21. The program method of claim 16, wherein the channel regions within the string are disposed in a semiconductor substrate under the word lines.

22. A program method of a flash memory device, the program method comprising:

providing a memory device comprising a drain select line, a source select line, and word lines, and having strings respectively connected between bit lines and a common source line;

in a floating state where channel regions within the string are not electrically connected to the bit lines, applying a ground voltage to a first bit line connected to a first string including a to-be programmed memory cell and applying a program-inhibited voltage to a second bit line connected to a second string including a program-inhibited cell;

in a state where the channel regions are not connected to the bit lines, electrically connecting first channel regions of memory cells, included in the first string, and second channel regions of memory cells, included in the second string, respectively, after applying the program-inhibited voltage;

in a state where the first and second channel regions are connected to each other, electrically connecting the first channel regions to the first bit line after electrically connecting the second channel regions; and executing a program operation so that a threshold voltage of the to-be programmed memory cell rises after electrically connecting the first channel regions to the first bit line.

23. The program method of claim 22, wherein:

the first channel regions are connected to each other according to a pass voltage applied to each of the word lines, and the second channel regions are connected to each other according to the pass voltage applied to each of the word lines.

24. The program method of claim 23, wherein as a channel boosting phenomenon is generated in each of the first and second channel regions by the pass voltage, a voltage of the first and second channel regions rises.

25. The program method of claim 22, wherein the first channel regions are connected to the first bit line as a drain select transistor of the first string is turned on according to a drain select voltage applied to the drain select line.

26. The program method of claim 22, wherein the drain select voltage has substantially the same value as that of the program-inhibited voltage.

27. The program method of claim 22, wherein in the application of the program-inhibited voltage, a source select voltage for turning off a source select transistor is applied to the source select line, and a positive voltage is applied to a common source line.

28. The program method of claim 22, wherein the channel regions within the string are disposed in a semiconductor substrate between the source select line and the drain select line.

29. The program method of claim 22, wherein the channel regions within the string are disposed in a semiconductor substrate under the word lines.

* * * * *